(12) United States Patent
Biard

(10) Patent No.: US 12,159,781 B2
(45) Date of Patent: *Dec. 3, 2024

(54) METHOD FOR MANUFACTURING A COMPOSITE STRUCTURE COMPRISING A THIN LAYER MADE OF MONOCRYSTALLINE SiC ON A CARRIER SUBSTRATE MADE OF SiC

(71) Applicant: Soitec, Bernin (FR)

(72) Inventor: Hugo Biard, Grenoble (FR)

(73) Assignee: SOITEC, Bernin (FR)

( * ) Notice: Subject to any disclaimer, the term of this patent is extended or adjusted under 35 U.S.C. 154(b) by 22 days.

This patent is subject to a terminal disclaimer.

(21) Appl. No.: 17/907,517

(22) PCT Filed: Jan. 12, 2021

(86) PCT No.: PCT/FR2021/050046
§ 371 (c)(1),
(2) Date: Sep. 27, 2022

(87) PCT Pub. No.: WO2021/191511
PCT Pub. Date: Sep. 30, 2021

(65) Prior Publication Data
US 2023/0197435 A1    Jun. 22, 2023

(30) Foreign Application Priority Data

Mar. 27, 2020 (FR) ...................... 2003024

(51) Int. Cl.
*C30B 25/18* (2006.01)
*C23C 14/48* (2006.01)
(Continued)

(52) U.S. Cl.
CPC ........ *H01L 21/02002* (2013.01); *C23C 14/48* (2013.01); *C23C 16/01* (2013.01);
(Continued)

(58) Field of Classification Search
CPC ......... C30B 1/023; C30B 25/18; C30B 29/36; C30B 31/22; C30B 33/10;
(Continued)

(56) References Cited

U.S. PATENT DOCUMENTS 8,436,363 B2    5/2013   Werkhoven et al.
2018/0251910 A1 9/2018   Akiyama et al.

FOREIGN PATENT DOCUMENTS

EP    1484794 A1    12/2004
EP    3168862 B1    5/2017
(Continued)

OTHER PUBLICATIONS

International Search Report for International Application No. PCT. FR2021/050046 dated Apr. 26, 2021, 2 pages.
(Continued)

*Primary Examiner* — Robert M Kunemund
(74) *Attorney, Agent, or Firm* — TraskBritt

(57) ABSTRACT

A method for manufacturing a composite structure comprising a thin layer made of monocrystalline silicon carbide arranged on a carrier substrate made of silicon carbide, the method comprising: a) a step of providing a donor substrate made of monocrystalline silicon carbide, b) a step of ion implantation of light species into the donor substrate, to form a buried brittle plane delimiting the thin layer between the buried brittle plane and a free surface of the donor substrate, c) a succession of n steps of forming crystalline carrier layers, with n greater than or equal to 2; the n crystalline carrier layers being positioned on the front face of the donor substrate successively one on the other, and forming the carrier substrate; each formation step comprising: direct liquid injection chemical vapor deposition, at a temperature below 900° C., to form a carrier layer, the carrier layer being formed by an at least partially amorphous (Continued)

SiC matrix, and having a thickness of less than or equal to 200 microns; a crystallization heat treatment of the carrier layer, at a temperature of less than or equal to 1000° C., to form a crystalline carrier layer; d) a step of separation along the buried brittle plane, to form, on the one hand, a composite structure comprising the thin layer on the carrier substrate and, on the other hand, the rest of the donor substrate.

18 Claims, 5 Drawing Sheets

(51) Int. Cl.
*C23C 16/01* (2006.01)
*C23C 16/32* (2006.01)
*C30B 1/02* (2006.01)
*C30B 29/36* (2006.01)
*C30B 31/22* (2006.01)
*C30B 33/10* (2006.01)
*H01L 21/02* (2006.01)

(52) U.S. Cl.
CPC ............ *C23C 16/325* (2013.01); *C30B 1/023* (2013.01); *C30B 25/18* (2013.01); *C30B 29/36* (2013.01); *C30B 31/22* (2013.01); *C30B 33/10* (2013.01); *H01L 21/02079* (2013.01)

(58) Field of Classification Search
CPC ......... H01L 21/02079; H01L 21/02002; C23C 14/48; C23C 16/01; C23C 16/325
See application file for complete search history.

(56) References Cited

FOREIGN PATENT DOCUMENTS

| | | |
|---|---|---|
| FR | 3000109 B1 | 1/2015 |
| JP | 2007-273524 A | 10/2007 |
| JP | 2009-102676 A | 5/2009 |
| TW | I269371 B | 12/2006 |
| WO | 2014/096690 A1 | 6/2014 |

OTHER PUBLICATIONS

International Written Opinion for International Application No. PCT/FR2021/050046 dated Apr. 26, 2021, 5 pages.
Mu et al., Room Temperature Wafer Bonding of Wide Bandgap Semiconductors, ECS Transactions, vol. 86, No. 5, (2018), pp. 3-21.
Taiwanese Office Action and Search Report for Application No. 110100921 dated Feb. 27, 2024, 6 pages with English Translation.

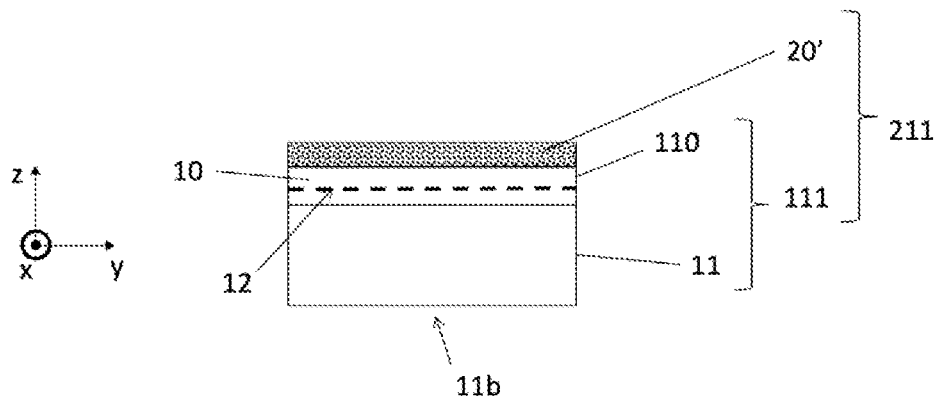
FIG. 2C(i)
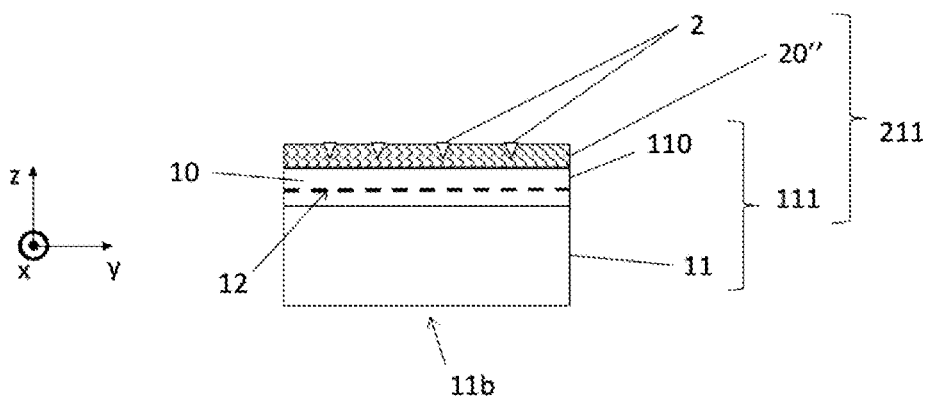
FIG. 2C(ii)
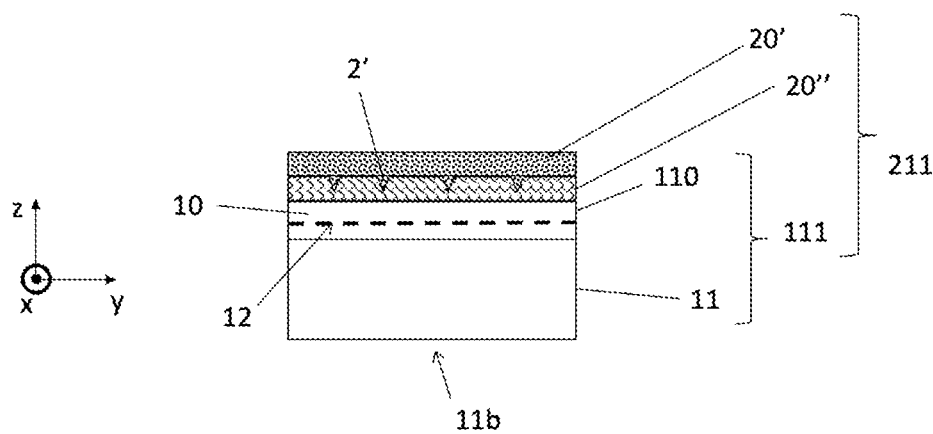
FIG. 2C(iii)

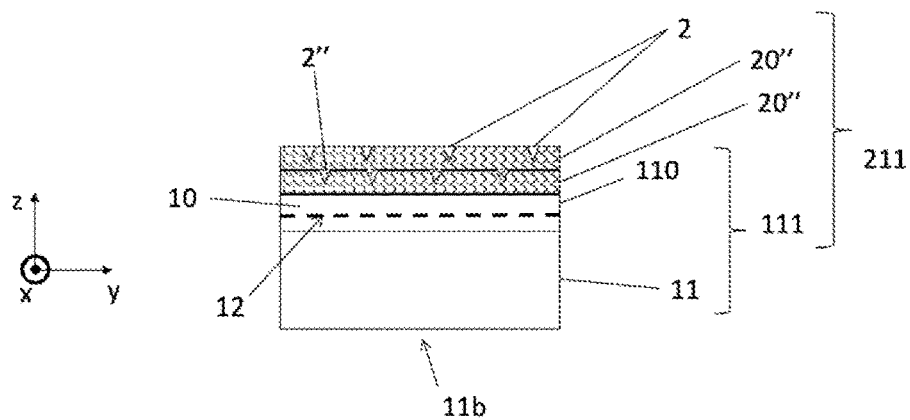
FIG. 2C(iv)
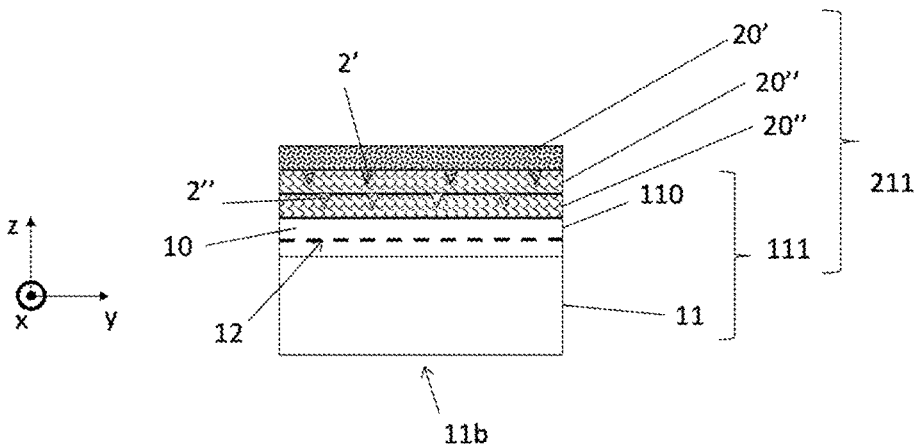
FIG. 2C(v)
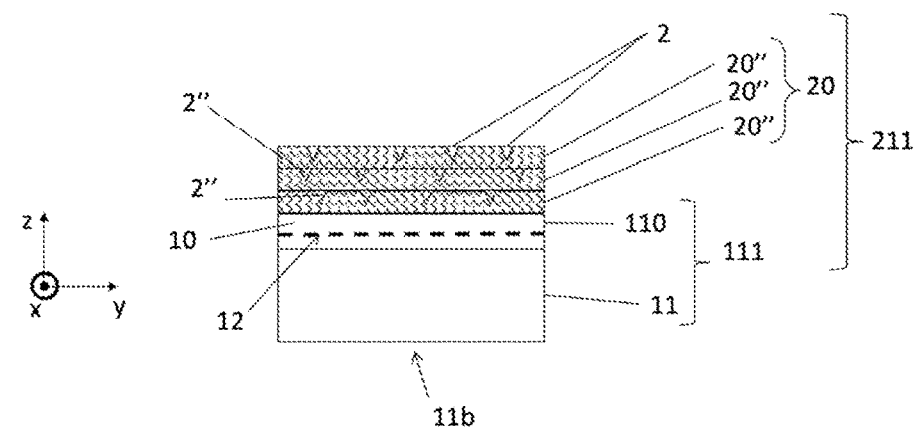
FIG. 2C(vi)

METHOD FOR MANUFACTURING A COMPOSITE STRUCTURE COMPRISING A THIN LAYER MADE OF MONOCRYSTALLINE SiC ON A CARRIER SUBSTRATE MADE OF SiC

CROSS-REFERENCE TO RELATED APPLICATIONS

This application is a national phase entry under 35 U.S.C. § 371 of International Patent Application PCT/FR2021/050046, filed Jan. 12, 2021, designating the United States of America and published as International Patent Publication WO 2021/191511 A1 on Sep. 30, 2021, which claims the benefit under Article 8 of the Patent Cooperation Treaty to French Patent Application Serial No. FR2003024, filed Mar. 27, 2020.

TECHNICAL FIELD

The present disclosure relates to the field of semiconductor materials for microelectronic components. The disclosure relates, in particular, to a process for manufacturing a composite structure comprising a thin layer made of monocrystalline silicon carbide on a carrier substrate made of silicon carbide.

BACKGROUND

Interest in silicon carbide (SiC) has increased considerably over the last few years because this semiconductor material can increase the energy handling capacity. SiC is increasingly widely used for manufacturing innovative power devices to meet the needs of rising fields in electronics, notably such as electric vehicles.

Power devices and integrated power supply systems based on monocrystalline silicon carbide are able to manage a much higher power density in comparison with their conventional homologues made of silicon, and do so with smaller active-zone dimensions. To further limit the dimensions of power devices on SiC, it is advantageous to manufacture vertical instead of lateral components. For this, vertical electrical conduction, between an electrode positioned on the front face of the SiC structure and an electrode positioned on the rear face, must be allowed by the structure.

Nevertheless, monocrystalline SiC substrates intended for the microelectronics industry remain expensive and difficult to supply at a large size. It is thus advantageous to make use of thin-layer transfer solutions to produce composite structures that typically comprise a thin layer of monocrystalline SiC on a less expensive carrier substrate. One well-known thin-layer transfer solution is the SMART CUT® process, based on implanting light ions and assembling by direct bonding. Such a process makes it possible, for example, to manufacture a composite structure comprising a thin layer made of monocrystalline SiC (c-SiC), taken from a c-SiC donor substrate, in direct contact with a carrier substrate made of polycrystalline SiC (p-SiC), and allowing vertical electrical conduction. However, it remains difficult to achieve high-quality direct bonding by molecular adhesion between two substrates made of c-SiC and p-SiC, since managing the surface state and roughness of the substrates is complex.

Various methods derived from this process are also known from the prior art. For example, F. Mu et al. (ECS Transactions, 86 (5) 3-21, 2018) implement direct bonding after activating the surfaces to be assembled by bombardment with argon (SAB: "surface activation bonding"): such a treatment prior to bonding generates a very high density of side bonds, which promote the formation of covalent bonds at the assembly interface, and hence a high bonding energy. However, this method has the drawback of generating an amorphous layer at the surface of the monocrystalline SiC donor substrate, which negatively affects vertical electrical conduction between the thin layer made of c-SiC and the carrier substrate made of p-SiC.

Solutions have been proposed to solve this problem, in particular, in EP3168862, involving the implantation of dopant species into the amorphous layer in order to restore its electrical properties. The main drawback of this approach is its complexity and hence its cost.

Also known is U.S. Pat. No. 8,436,363, which describes a process for manufacturing a composite structure comprising a thin layer made of c-SiC arranged on a metal carrier substrate, the coefficient of thermal expansion of which is matched to that of the thin layer. This manufacturing process comprises the following steps:

forming a buried brittle plane in a c-SiC donor substrate, delimiting a thin layer between the buried brittle plane and a front surface of the donor substrate;

depositing a layer of metal, for example, of tungsten or molybdenum, on the front surface of the donor substrate to form the carrier substrate with sufficient thickness to act as a stiffener; and separating along the buried brittle plane to form, on the one hand, the composite structure comprising the metal carrier substrate and the thin layer made of c-SiC and, on the other hand, the rest of the c-SiC donor substrate.

Such a manufacturing process is, however, not compatible when the material forming the carrier substrate is p-SiC requiring deposition at temperatures above 1200° C. (usual temperatures for the manufacture of p-SiC). Specifically, at these high temperatures, the growth kinetics of the cavities present in the buried brittle plane are faster than the growth kinetics of the p-SiC layer and the thickness required for a stiffening effect is not reached before blistering starts to occur, which is related to the deformation of the layer vertically in line with the cavities.

Irrespective of the layer transfer technique used, the additional problem arises of providing a composite structure comprising a thin c-SiC layer of very high quality and, in particular, free of extended defects (or having a very low density thereof), which are liable to affect the performance qualities and the reliability of power devices intended to be produced on the thin layer.

BRIEF SUMMARY

The present disclosure is an alternative solution to those of the prior art, and is directed towards completely or partly overcoming the abovementioned drawbacks. The disclosure relates, in particular, to a process for manufacturing a composite structure comprising a high-quality thin layer made of c-SiC on a lower-quality carrier substrate made of SiC.

The present disclosure is a process for manufacturing a composite structure comprising a thin layer made of monocrystalline silicon carbide arranged on a carrier substrate made of silicon carbide. The process comprises the following steps:

a) a step of providing a donor substrate made of monocrystalline silicon carbide, b) a step of ion implantation of light species into the donor substrate, to form a buried brittle plane delimiting the thin layer between the buried brittle plane and a free surface of the donor substrate, c) a succession of n steps of forming crystalline carrier layers, with n greater than or equal to 2; the n crystalline carrier layers being positioned on the front face of the donor substrate successively one on the other, and forming the carrier substrate; each formation step comprising:
direct liquid injection chemical vapor deposition, at a temperature below 900° C., to form a carrier layer, the carrier layer being formed by an at least partially amorphous SiC matrix, and having a thickness of less than or equal to 200 microns;
a crystallization heat treatment of the carrier layer, at a temperature of less than or equal to 1000° C., to form a crystalline carrier layer;

d) a step of separation along the buried brittle plane, to form, on the one hand, a composite structure comprising the thin layer on the carrier substrate and, on the other hand, the rest of the donor substrate.

According to other advantageous and non-limiting features of the disclosure, taken alone or in any technically feasible combination:

the process comprises a step e) of mechanical and/or chemical treatment(s) of the composite structure, the treatment(s) being applied to a free face of the carrier substrate, the rear face of the composite structure, and/or to a free face of the thin layer, the front face of the composite structure;

step e) comprises simultaneous mechanochemical polishing of the front face and of the rear face of the composite structure;

chemical etching, mechanical grinding and/or mechanochemical polishing is (are) applied to a free face of the carrier substrate, between step c) and step d);

the thickness of each deposited carrier layer is less than or equal to 100 microns, or even less than 50 microns, or else even less than 10 microns;

the depositions of step c) are performed at a temperature of between 100° C. and 800° C., or even preferentially between 200° C. and 600° C.;

the depositions of step c) are performed at a pressure of between 1 Torr and 500 Torr;

the precursors used during the depositions of step c) are chosen from polysilylethylene and disilabutane;

step c) comprises a succession of n steps of forming crystalline carrier layers, with n between 3 and a few dozen;

step a) comprises a step a') of providing an initial substrate made of monocrystalline silicon carbide, and a step a") of epitaxial growth of a monocrystalline silicon carbide donor layer on the initial substrate, to form the donor substrate, the donor layer having a density of crystal defects less than that of the initial substrate, step a') comprises the formation, on the initial substrate, of a monocrystalline conversion layer, to convert basal plane dislocation defects of the initial substrate into threading edge dislocation defects;

the epitaxial growth step a") is performed at a temperature above 1200° C., preferentially between 1500° C. and 1650° C.;

the separation step d) is performed at a temperature greater than or equal to the temperature of the crystallization heat treatments of step c);

the process comprises a step of reconditioning the rest of the donor substrate for the purpose of reusing it as initial substrate or as donor substrate.

BRIEF DESCRIPTION OF THE DRAWINGS

Other features and advantages of the present disclosure will become apparent from the following detailed description of example embodiments of the present disclosure, which is given with reference to the accompanying figures, in which:

FIGS. 2A to 2F show steps of a manufacturing process in accordance with the disclosure.

DETAILED DESCRIPTION

Figure 1:
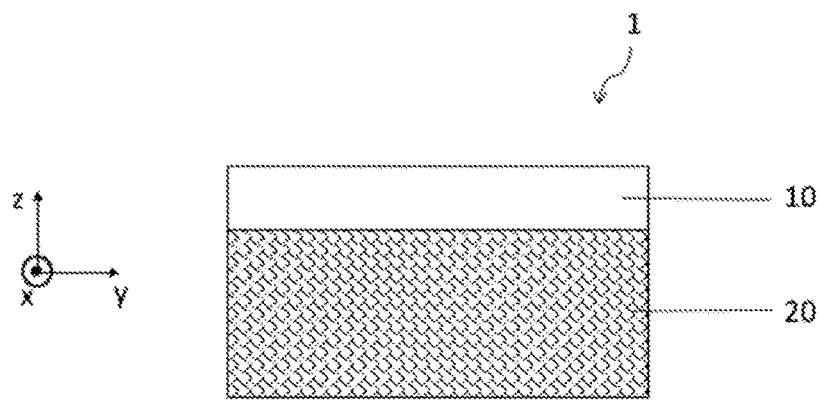
FIG. 1 shows a composite structure produced according to a manufacturing process in accordance with the disclosure.

In the description, the same reference numerals in the figures may be used for elements of the same type. The figures are schematic representations that, for the sake of legibility, are not to scale. In particular, the thicknesses of the layers along the z-axis are not to scale with respect to the lateral dimensions along the x- and y-axes; and the relative thicknesses of the layers with respect to each other are not respected in the figures.

The present disclosure relates to a process for manufacturing a composite structure 1 comprising a thin layer 10 made of monocrystalline silicon carbide arranged on a carrier substrate 20 made of silicon carbide (FIG. 1). The carrier substrate 20 is advantageously polycrystalline ("p-SiC" will be used to refer to polycrystalline SiC).

The process first comprises a step a) of providing a donor substrate 111 made of monocrystalline silicon carbide. Throughout the rest of the description, "c-SiC" will be used to refer to monocrystalline silicon carbide.

The donor substrate 111 is preferentially in the form of a wafer with a diameter of 100 mm, 150 mm or 200 mm, or even 300 mm or even 450 mm, and a thickness typically between 300 and 800 microns. It has a front face 11a and a rear face 11b. The surface roughness of the front face 11a is advantageously chosen to be less than 1 nm Ra (average roughness), measured by atomic force microscopy (AFM) on a scan of 20 microns×20 microns.

Figure 2A:
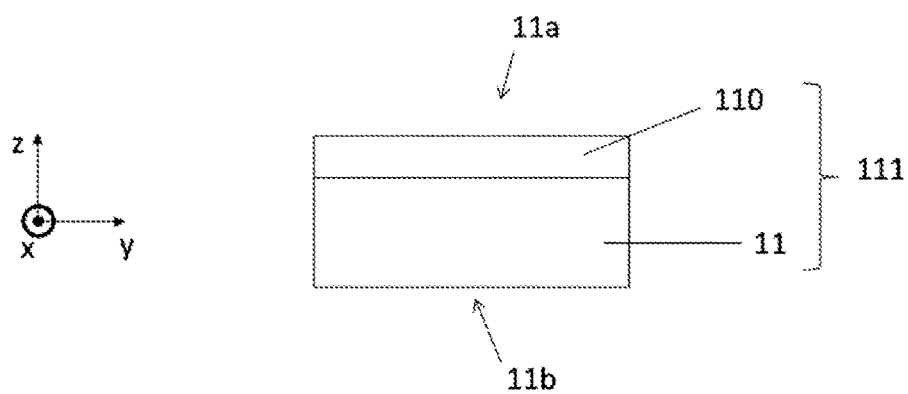

According to an advantageous embodiment, step a) comprises a step a') of providing an initial substrate 11 made of monocrystalline silicon carbide. The process then comprises a step a") of epitaxial growth of a monocrystalline silicon carbide donor layer 110 on the initial substrate 11, to form the donor substrate 111 (FIG. 2A). The epitaxial growth step is performed so that the donor layer 110 has a crystal defect density less than that of the initial substrate 11.

For example, the initial substrate 11 made of c-SiC may be of the 4H or 6H polytype, with an offcut angle less than 4.0°±0.5° relative to the <11-20> crystallographic axis, and a threading dislocation (micropipe) density of less than or equal to 5/cm$^2$, or even less than 1/cm$^2$. In N-(nitrogen-) doped form, it preferentially has a resistivity of between 0.015 ohm.cm and 0.030 ohm.cm. Needless to say, the dopant may be other than nitrogen and the doping may optionally be of P type. An initial substrate 11 having a low density of basal plane dislocation (BPD) defects, typically less than or equal to 3000/cm$^2$, may be chosen. c-SiC substrates having BPD densities of the order of 1500/cm$^2$ are reasonably available, which facilitates their supply.

It is advantageous for the donor layer 110, from which the c-SiC thin layer 10 of the composite structure 1 will be formed on conclusion of the process of the disclosure, to have an excellent crystal quality, to meet the specifications required for the vertical components intended to be produced on the thin layer 10. This is because various types of extended defects are present in a layer or a substrate made of c-SiC. These extended defects can affect the performance qualities and the reliability of the components. In particular, defects of BPD type are fatal for bipolar components, since a Shockley stacking fault (or SSF) is extended from the dislocation when the energy for recombination of an electron-hole pair is available. The expansion of an SSF stacking fault inside the active region of the component brings about an increase in the passing state resistance of the component.

The c-SiC donor layer 110 is thus produced so as to have a BPD defect density of less than or equal to $1/cm^2$.

For this, the epitaxial growth step a") is performed at a temperature above 1200° C., preferentially between 1500° C. and 1650° C. The precursors used are silane (SiH4), propane (C3H8) or ethylene (C2H4); the carrier gas may be hydrogen with or without argon.

The low content of BPD defects in the donor layer 110 is obtained by favoring the conversion of the BPD defects present in the initial substrate 11 into threading edge dislocations (TED).

Figure 3A:
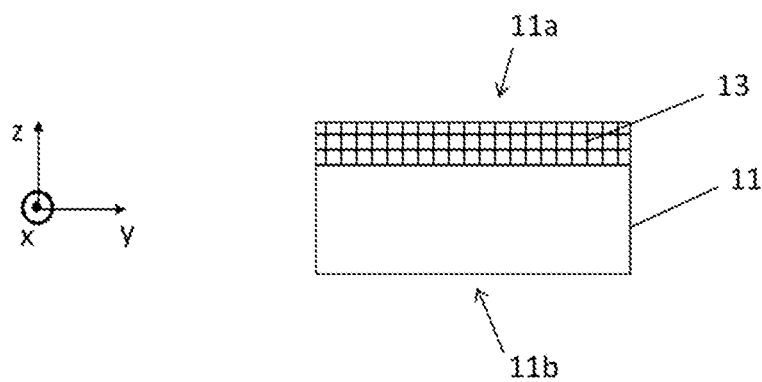
FIGS. 3A and 3B show steps of a manufacturing process in accordance with the present disclosure.

According to a particular embodiment, step a") comprises the formation of a monocrystalline conversion layer 13, preferentially made of c-SiC, to maximize the conversion of the BPD defects of the initial substrate 11 into TED defects (FIG. 3A). For this, it is advantageous to choose a low cutting angle close to 4° for the initial c-SiC substrate 11, to increase the in situ etching performed before the epitaxial growth, to target large growth rates (typically greater than 5 µm/h) and finally to choose growth conditions for the monocrystalline conversion layer 13, with a C/Si ratio in the precursor streams of close to 1.

Figure 3B:
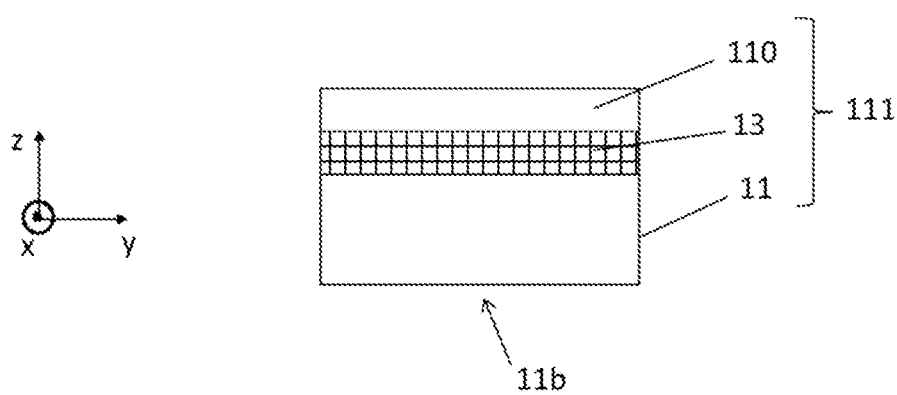

The epitaxial growth of the donor layer 110 on the monocrystalline conversion layer 13 can then be performed (FIG. 3B). According to this particular embodiment, it is also possible to obtain a c-SiC donor layer 110 with a BPD defect density of less than or equal to $1/cm^2$ or even less than $0.1/cm^2$. Furthermore, the probability of bipolar degradation (probability of a hole arriving under the BPD/TED conversion point) on conclusion of the process according to the present disclosure is negligible (<0.1%), the monocrystalline conversion layer 13 not being intended to be transferred into the composite structure 1. The prior art directed toward reducing bipolar degradations consists in incorporating, between the conversion layer and the active layer, a recombination layer (nitrogen-doped beyond $1^E18$ at/cm$^3$). This layer can, at the cost of a thickness of 10 µm and of a concentration of greater than $5^E18/cm^3$, reduce the probability of the presence of holes to 0.1% relative to the base structure not including this recombination layer. In the present disclosure, since the monocrystalline conversion layer 13 is not transferred, the probability of a hole reaching the nucleation point of the bipolar degradation (BPD-TED conversion point or any BPD point) is at least less than 0.1%, or even close to 0%.

It is noted that conventional sequences of cleaning or etching of the initial substrate 11, directed toward eliminating all or some of the particulate, metallic or organic contaminants, or a native oxide layer that are potentially present on its front face 11a, may be performed prior and/or subsequent to the epitaxial growth step a").

Alternatively, the donor substrate 111 may be formed solely from an initial substrate 11 with a low defect density, which is compatible with the specifications of the future thin layer 10; this layer will then be taken from the donor substrate 111 as described below in the following steps of the process.

Figure 2B:
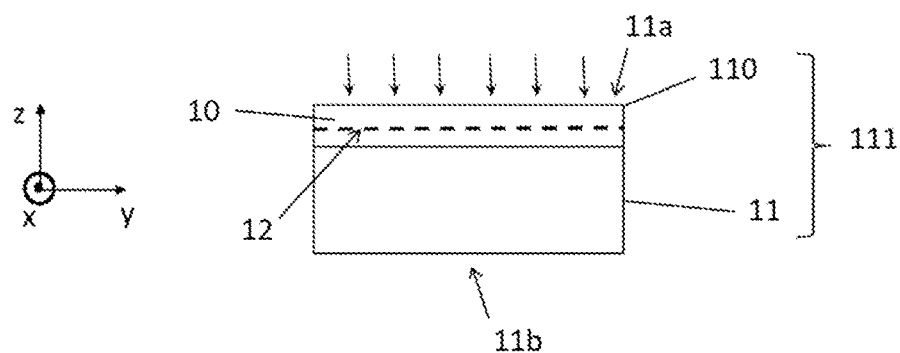

The manufacturing process according to the disclosure also comprises a step b) of ion implantation of light species into the donor substrate 111 (and, in particular, into the donor layer 110 when the latter is present), down to a predetermined depth representative of the desired thickness of thin layer 10. It should be noted that the depth will always remain less than the thickness of the donor layer 110 when it is present. This implantation generates a buried brittle plane 12 in the donor substrate 111 that delimits the thin layer 10 between the buried brittle plane 12 and a free surface 11a of the donor substrate 111 (FIG. 2B).

The implanted light species are preferentially hydrogen, helium or these two species co-implanted. As is well known with reference to the SMART CUT® process, these light species will form, around the predetermined depth, microcavities distributed in a thin layer parallel to the free surface 11a of the donor substrate 111, i.e., parallel to the plane (x, y) in the figures. This thin layer is referred to as the buried brittle plane 12, for the sake of simplicity.

The energy for implanting the light species is chosen so as to reach the predetermined depth in the donor substrate 111.

Typically, hydrogen ions will be implanted at an energy of between 10 keV and 250 keV, and at a dose of between $5^E16/cm^2$ and $1^E17/cm^2$, to delimit a thin layer 10 having a thickness of about 100 to 1500 nm.

It should be noted that a protective layer could be deposited on the free face of the donor substrate 111 prior to the ion implantation step. This protective layer may be composed of a material such as silicon oxide or silicon nitride, for example.

The process according to the disclosure then comprises a succession of n steps of formation of crystalline carrier layers 20", with n greater than or equal to 2. The number of successive formation steps may be greater than or equal to 3; it may typically range up to a few dozen.

The n crystalline carrier layers 20" are arranged on the front face 11a of the donor substrate 111, successively one on the other; they form the carrier substrate 20. In other words, a first crystalline carrier layer 20" is directly in contact with the front face 11a of the donor substrate 111, then a second crystalline carrier layer 20" is in contact with the first, and so on for the n crystalline carrier layers 20" (FIGS. 2C(i) to 2C(vi)).

Each formation step comprises direct liquid injection chemical vapor deposition (DLI-CVD) followed by a crystallization heat treatment of the deposited carrier layer 20'.

The DLI-CVD deposition is performed at a temperature below 900° C. and preferentially at a temperature of between 100° C. and 800° C., between 100° C. and 700° C., or even advantageously between 200° C. and 600° C. The pressure in the deposition chamber is defined between 1 Torr and 500 Torr.

The DLI-CVD deposition technique affords good yields between the materials (precursors) supplied and the deposition thicknesses achieved, without the need to use chlorinated precursors, which limits the costs and the environmental constraints.

Preferentially, the DLI-CVD deposition involves a disilabutane precursor or a polysilylethylene precursor, the precursor being pure or diluted. Other precursors such as methyltrichlorosilane, ethylenetrichlorosilane, dichloromethylvinylsilane, tetraethylsilane, tetramethylsilane, diethylmethylsilane, bistrimethylsilylmethane or hexamethyldisilane may optionally be used.

The DLI-CVD deposition technique is described in the thesis by Guilhaume Boisselier (2013, "Dépôt chimique en phase vapeur de carbures de chrome, de silicium et d'hafnium assisté par injection liquide pulsée [Pulsed liquid injection-chemical vapor deposition of chromium, silicon and hafnium carbides]"), for applications in the deposition of ceramic coatings onto parts, to protect them during very high temperature treatments, for example, of steel or alloy metal parts.

The Applicant has developed a DLI-CVD deposition for an entirely different application, namely the formation of a carrier layer 20' deposited on a c-SiC donor substrate 111, to obtain, on conclusion of the manufacturing process, a composite structure 1 intended for the microelectronics field.

The deposited carrier layer 20' forms an SiC matrix comprising amorphous SiC, and reaction byproducts derived from the precursors used during the deposition and formed from carbon chains. In addition, the SiC matrix may optionally comprise crystalline SiC grains.

In general, the carrier layer 20' will have a thickness of less than or equal to 200 microns, less than or equal to 100 microns, less than or equal to 50 microns, less than or equal to 10 microns, or even less than or equal to a few microns. It is noted that the DLI-CVD technique can afford a deposition rate of greater than or equal to 10 microns/hour, or even greater than 50 microns/hour, or else even greater than 100 microns/hour.

The thickness of each carrier layer 20' deposited can be identical, but this is not required. According to one option, the thicknesses of the n carrier layers 20' successively deposited are increasing; this may limit the harmful influence of the difference in coefficients of thermal expansion of the layers present in the structure: thinner carrier layers 20' deposited at the start are subject to fewer constraints in the structure (notably during the crystallization heat treatment following the deposition) than thick layers, and make it possible to change the coefficient of thermal expansion toward a moderate coefficient, which is more favorable to the subsequent deposition of thicker carrier layers 20'.

According to another option, the thicknesses of the n carrier layers 20' successively deposited are decreasing; this affords the advantage of gradually reducing the size of the cracks generated during the crystallization heat treatment of the deposited carrier layer 20', which treatment will be detailed later in the description.

It is noted that step c) is advantageously directed toward defining a non-insulating interface between the donor substrate 111 and the carrier substrate 20. In other words, step c) is performed such that the interface between the donor substrate 111 and the carrier substrate 20 in the final composite structure 1 is electrically conductive: the aim will be for a specific resistance of the interface of preferentially less than 1 mohm.cm$^2$. Advantageously, to ensure the electrical conductivity of the interface, removal of the native oxide present on the front face 11a of the donor substrate 111 is performed by HF (hydrofluoric acid) deoxidation, via a wet or dry route. Alternatively, overdoping at least of the first deposited nanometers of the first carrier layer 20' may be performed by introducing dopant species during the DLI-CVD deposition. It should be noted that, in general, dopant species may be introduced (in various dosages) during the n depositions of step c) according to the level of doping and the electrical conductivity targeted for the carrier substrate 20.

Advantageously also, prior to the deoxidation and/or to the formation of the first carrier layer 20', cleaning sequences are applied to the donor substrate 111 to remove all or some of the particulate, metallic or organic contaminants potentially present on its free faces.

After the DLI-CVD deposition, step c) comprises a crystallization heat treatment of the carrier layer 20', at a temperature of less than or equal to 1000° C., to form a crystalline carrier layer 20". The temperature of the heat treatment may be, for example, 950° C. or 900° C. or else 800° C. The annealing atmosphere may notably comprise gases such as argon, nitrogen, hydrogen, helium or a mixture of these gases.

Such annealing has the effect of eliminating the hydrogen from the carrier layer 20' and of bringing about crystallization of the SiC matrix in the form of polycrystalline SiC.

A conventional furnace for treating a plurality of structures simultaneously (batch annealing) may be used to perform the crystallization heat treatment. The typical duration of the treatment is then between a few minutes and a few hours.

The crystallization heat treatment may alternatively be performed in a rapid thermal processing (RTP) furnace. The typical annealing time is between a few seconds and a few minutes.

Finally, it may also be envisaged to perform the crystallization heat treatment in situ, in the DLI deposition chamber, for a typical time of the order of a few minutes.

The relatively low thickness of the deposited carrier layer 20' allows rapid crystallization, which prevents the thermal budget of the crystallization heat treatment from causing excessive growth of the cavities in the buried brittle plane 12 of the donor substrate 111. For example, for a carrier layer 20' with a thickness of 10 microns, a crystallization heat treatment at 800° C. for 10 minutes may be applied; such a thermal budget is insufficient to exceed the critical density and size (bubbling or spontaneous separation along the buried brittle plane 12) of the cavities present in the buried brittle plane 12 of the donor substrate 111.

It is important to note that the crystallization of each carrier layer 20' often causes cracks 2 in the crystalline carrier layer 20", which has an impact on its mechanical and electrical quality. This is why the process according to the disclosure envisages a succession of steps for forming the crystalline carrier layer 20".

As may be seen in FIG. 2C(i), a first carrier layer 20' is deposited on the donor substrate 111 during a first DLI-CVD deposition. A first crystallization heat treatment is then applied to the stack, which brings about transformation of the first carrier layer 20' into a first crystalline carrier layer 20" in the form of poly-SiC, and the appearance of cracks 2 in the crystalline carrier layer 20" (FIG. 2C(ii)).

A second DLI-CVD deposition is then performed, on the free surface of the first crystalline carrier layer 20" (FIG. 2C(iii)) and notably in the cracks 2: this thus gives a second superficial carrier layer 20' and also cracks 2' filled with the same material (at least partially amorphous SiC matrix) as the second carrier layer 20'. A second crystallization heat treatment is applied to the stack, which brings about transformation of the second carrier layer 20' into a second crystalline carrier layer 20" in the form of p-SiC, and the appearance of cracks 2 in the second crystalline carrier layer 20" (FIG. 2C(iv)). The SiC matrix present in the cracks 2" of the first crystalline carrier layer 20" also crystallizes in the form of p-SiC, which makes it possible to heal the initial superficial cracks 2 of the first crystalline carrier layer 20".

A third DLI-CVD deposition may then be performed, on the free surface of the second crystalline carrier layer 20" (FIG. 2C(v)) and notably in the emerging cracks 2: this thus gives a third carrier layer 20' and also cracks 2' filled with the same material as the third carrier layer 20'. A third crystallization heat treatment is applied to the stack, which brings about transformation of the third carrier layer 20' into a third crystalline carrier layer 20" in the form of p-SiC, and the appearance of cracks 2 in the third crystalline carrier layer 20" (FIG. 2C(vi)). The SiC matrix present in the cracks 2" of the second crystalline carrier layer 20" also crystallizes in the form of p-SiC, which makes it possible to heal the initial cracks 2 in the second layer.

It should be noted that the n DLI-CVD depositions may be performed at different temperatures, as may the n crystallization annealing operations.

The process includes at least two successive steps for forming crystalline carrier layers 20". By way of example, FIGS. 2C(i) to 2C(vi) show three of them, but it is entirely envisageable to perform between two and 10, or even a few dozen successive deposition and crystallization steps, until the carrier substrate 20 formed by the superposition of the crystalline carrier layers 20" is obtained.

The deposition parameters and crystallization annealing parameters of step c) are determined so that the carrier substrate 20 has:
  good electrical conductivity, i.e., less than 0.03 ohm.cm, or even less than 0.01 ohm.cm,
  high thermal conductivity, i.e., greater than or equal to 150 W·m$^{-1}$·K$^{-1}$, or even 200 W·m$^{-1}$·K$^{-1}$,
  and a coefficient of thermal expansion close to that of the thin layer 10, i.e., typically between $3.8^E$–6/K and $4.2^E$–6/K at room temperature.

To obtain these properties, the following structural characteristics are preferentially targeted for the carrier substrate 20: polycrystalline structure, grains of 3C SiC type, 111 oriented, with a mean size of 1 to 50 μm in the main plane of the substrate, N-type doping for a final resistivity of less than or equal to 0.03 ohm.cm, or even less than or equal to 0.01 ohm.cm.

On conclusion of step c), the carrier substrate 20 has a sufficient thickness to perform the following separation step d), and advantageously the desired thickness for the composite structure 1. The thickness of the carrier substrate 20 may thus be greater than or equal to 10 microns, 50 microns, or even greater than or equal to 100 microns.

The stack 211 resulting from step c) comprises the carrier substrate 20 arranged on the donor substrate 111.

Figure 2D:
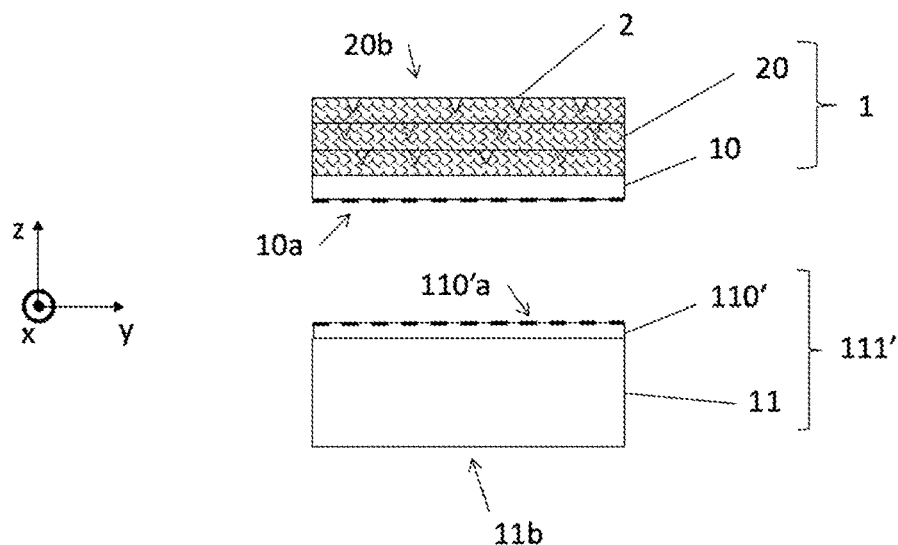

The process according to the present disclosure then comprises a step d) of separation along the buried brittle plane 12, to form, on the one hand, the composite structure 1 and, on the other hand, the rest 111' of the donor substrate (FIG. 2D).

According to an advantageous embodiment, the separation step d) is performed by applying a heat treatment to the stack 211, at a separation temperature greater than or equal to the deposition and crystallization temperatures of step c). Specifically, the microcavities present in the buried brittle plane 12 follow growth kinetics until the initiation of a fracture wave that will propagate over the entire extent of the buried brittle plane 12 and result in separation between the composite structure 1 and the rest of the initial substrate 111'. In practice, the temperature may be between 950° C. and 1200° C. and preferentially between 1000° C. and 1200° C., as a function of the implantation conditions of step b).

According to an alternative embodiment, the separation step d) is performed by applying a mechanical stress to the stack 211, optionally preceded by a heat treatment to embrittle the buried brittle plane 12. The stress may be exerted, for example, by inserting a tool (e.g.: razor blade) close to the buried brittle plane 12. By way of example, the separation stress may be of the order of a few gigapascals, preferentially greater than 2 GPa.

According to another embodiment, the separation step d) may be performed during the final ($n^{th}$) crystallization annealing of step c). In such a case, it may optionally be envisaged to perform, after separation, at least one $(n+1)^{th}$ DLI-CVD deposition to further thicken the carrier substrate 20 and at least one $(n+1)^{th}$ crystallization annealing to form the p-SiC.

After step d), a composite structure 1 is obtained comprising a thin layer 10 made of monocrystalline silicon carbide arranged on a carrier substrate 20 made of polycrystalline silicon carbide.

As is known per se, on conclusion of the separation step d), the free face 10a of the thin layer 10 of the composite structure 1 has a surface roughness of between 5 and 100 nm RMS (measured with an atomic force microscope (AFM), on scans of 20 microns×20 microns).

Figure 2E:
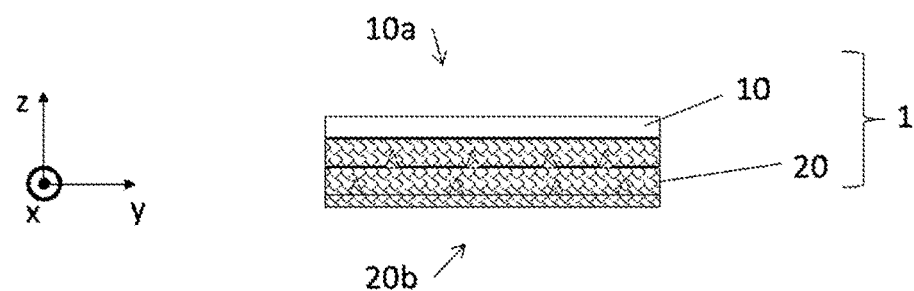

A step e) of mechanical and/or chemical treatment(s) of the composite structure 1 may thus be envisaged to smooth the free surface 10a of the thin layer 10 and to correct the thickness uniformity of the composite structure 1 (FIG. 2E).

Step e) may comprise mechanochemical polishing (MCP) of the free face 10a of the thin layer 10, typically with removal of material of the order of 50 nm to 1000 nm, so as to obtain a final roughness of less than 0.5 nm RMS (on an AFM field of 20×20 μm), or even less than 0.3 nm. Step e) may also comprise a chemical or plasma treatment (cleaning or etching), for example, cleaning of SC1/SC2 type (Standard Clean 1, Standard Clean 2) and/or HF (hydrofluoric acid), and/or an N2, Ar, CF4, etc., plasma, to further improve the quality of the free face 10a of the thin layer 10.

Moreover, step e) may comprise mechanochemical polishing (MCP) and/or a chemical treatment (etching or cleaning) and/or a mechanical treatment (grinding) of the rear face 20b of the carrier substrate 20. This makes it possible to remove all or some of the residual cracks 2. Such a treatment also makes it possible to improve the thickness uniformity of the carrier substrate 20 and also its rear face 20b roughness. A roughness of less than 0.5 nm RMS (measured with an atomic force microscope (AFM) on fields of 20 microns×20 microns) is desired to produce vertical components, for which at least one metal electrode will be present on the rear face 20b of the composite structure 1.

It should be noted that these treatments applied to the rear face 20b of the carrier substrate 20 may optionally be applied just before the separation step d), i.e., before the front face 10a of the composite structure 1 is laid bare, so as to limit its contamination, notably in the course of polluting or restrictive treatments such as chemical etching or mechanical grinding.

Polishing or grinding of the edges of the composite structure 1 may also be performed during this step e) to render the shape of its circular contour and the cutting edge waste compatible with the requirements of microelectronic manufacturing processes.

According to an advantageous embodiment, the mechanochemical treatment step e) comprises simultaneous polishing (MCP) of a front face 10a and of a rear face 20b of the composite structure 1, to make the composite structure 1 smooth and to improve its thickness uniformity. The polishing parameters may differ between the front face and the rear face, the smoothing of a c-SiC surface and of a p-SiC surface usually requiring different consumables. The mechanical component of the polishing is favored, in particular, for the rear face 20b when the carrier substrate 20 is made of p-SiC, to limit the preferential attack of the grain joints by the chemical component of the polishing. By way of example, the polishing parameters, such as the spin speed (polishing head and plate), the pressure, the concentration and physical properties of the abrasives (i.e., diamond nanoparticle diameter between about 10 nm and 1 μm), may be modified to accentuate the mechanical component.

Optionally, a step e') of heat treatment at a temperature of between 1000° C. and 1800° C., for about one hour and up to a few hours, is performed after step e). The object of this step is to stabilize the composite structure 1, by healing structural or surface defects, still present in and/or on the thin layer 10, and, where appropriate, by making the crystalline configuration of the carrier substrate 20 evolve, so that the composite structure 1 is compatible with the subsequent high-temperature heat treatments required for the manufacture of components on the thin layer 10. Such a heat treatment may also have the advantage of restoring good electrical conductivity at the deposit interfaces of the layers that have formed the carrier substrate 20.

Figure 2F:
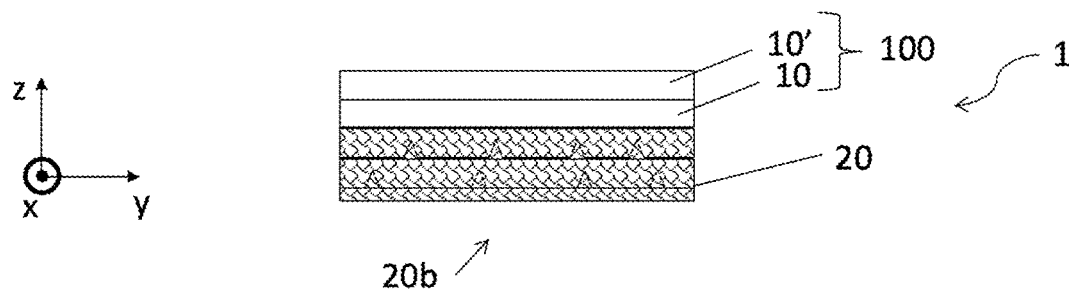

The process according to the disclosure may comprise a second step f) of epitaxial growth of an additional layer 10' of monocrystalline silicon carbide on the thin layer 10 of the composite structure 1 (FIG. 2F). Such a step is applied when a relatively large thickness of working layer 100 is required for the manufacture of components, typically from about 5 to 50 microns.

It may be chosen to limit the temperatures applied during this step f), so as to restrict the stresses induced in the working layer 100 (corresponding to the combination of the thin layer 10 and the additional layer 10') because of the composite structure 1.

Finally, the manufacturing process may comprise a step of reconditioning the rest 111' of the donor substrate for the purpose of reusing it as initial substrate 11 or as donor substrate 111. Such a reconditioning step is based on one or more treatments of the face 110'a (FIG. 2D), by surface or edge mechanochemical polishing, and/or by mechanical grinding, and/or by wet or dry chemical etching.

Preferentially, the thickness of the donor layer 110 formed in step a") is defined so that the rest 111' of the donor substrate 111 can be reused at least twice as donor substrate 111.

Preferentially, when the monocrystalline conversion layer 13 is present, care will be taken to keep the layer intact, i.e., to always keep a portion of donor layer 110 on the rest 111' of the donor substrate. Thus, when the portion of donor layer 110 is insufficient for the production of a composite structure 1, only the step of epitaxial growth of the donor layer 110 is necessary and not the prior step of growth of the monocrystalline conversion layer 13.

EXAMPLE

According to a non-limiting implementation example, the initial substrate 11 provided in step a') of the manufacturing process is a wafer made of c-SiC of 4H polytype, with an orientation of 4.0°±0.5° relative to the <11-20> axis, with a diameter of 150 mm and a thickness of 350 μm.

A conventional RCA cleaning sequence (Standard Clean 1+Standard Clean 2) followed by Caro's acid (mixture of sulfuric acid and hydrogen peroxide) and then HF (hydrofluoric acid) is performed on the initial substrate 11 prior to step a") of epitaxial growth of the c-SiC donor layer 110.

The growth is performed in an epitaxy chamber, at a temperature of 1650° C., with precursors such as silane (SiH4) and propane (C3H8) or ethylene (C2H4), generating the c-SiC donor layer 110 with a thickness of 30 microns (growth rate: 10 microns/h). The donor layer has a BPD defect density of the order of $1/cm^2$.

Hydrogen ions are implanted at an energy of 150 keV and a dose of $6^E16$ H+/$cm^2$ through the free surface of the donor layer 110. A buried brittle plane 12 is thus created at a depth of about 800 nm in the initial substrate 11.

A cleaning sequence of RCA+Caro's acid is performed on the donor substrate 111 so as to remove potential contaminants from the free face of the donor layer 110.

A first DLI-CVD deposition is performed on the donor layer 110, at a temperature of 650° C., with the disilabutane (DSB) precursor, at a pressure of 50 Torr, for 80 minutes, so as to reach a thickness of 140 microns for the first carrier layer 20'. Under these conditions, the carrier layer 20' forms an amorphous SiC matrix, comprising reaction byproducts derived from the deposition precursors.

A first crystallization annealing operation at 800° C. is then applied to the stack 211 for less than 15 minutes, under a neutral atmosphere of nitrogen or argon. Crystallization of the first p-SiC carrier layer 20' causes the appearance of cracks 2.

A second DLI-CVD deposition is performed on the first crystalline carrier layer 20", under the same conditions as the first deposition, so as to reach a thickness of 140 microns for the second carrier layer 20'. This deposition also makes it possible to fill the superficial cracks of the first crystalline carrier layer 20". The second carrier layer 20' also forms an at least partially amorphous SiC matrix.

A second crystallization annealing operation similar to the first annealing operation is then performed. Crystallization of the SiC matrix deposited in the cracks 2" makes it possible to heal the first crystalline carrier layer 20". The second crystalline carrier layer 20" is also formed from p-SiC and cracks 2 appear in this second carrier layer 20".

A third DLI-CVD deposition is performed on the second crystalline carrier layer 20", followed by a third crystallization annealing operation, identical to the preceding ones.

Finally, a fourth DLI-CVD deposition is performed on the third crystalline carrier layer 20", followed by a fourth crystallization annealing operation, also identical to the preceding ones.

It should be recalled that the various depositions and crystallization annealing operations may entirely be performed under conditions that are different from each other.

The fourth crystalline carrier layer 20" is formed from p-SiC and cracks 2 appear in this fourth crystalline carrier layer 20".

The carrier substrate 20 formed by the superposition of the four crystalline carrier layers 20" has a thickness of about 560 microns.

Annealing at 1000° C. for 50 minutes is then applied to the stack formed of the donor substrate 111 and of the carrier substrate 20. Separation is performed at the level of the buried brittle plane 12 during the annealing. On conclusion of this separation step d), the composite structure 1 formed of the thin layer 10 and of the carrier substrate 20 is separated from the rest 111' of the donor substrate.

Grinding of the rear face of the carrier substrate 20 is performed to remove the zone including residual cracks 2. To do this, a thickness of the order of 100 to 200 microns is removed from the rear face of the carrier substrate 20.

One or more mechanochemical polishing operations are then performed to restore the surface roughness of the thin layer 10 and of the rear face of the carrier substrate 20, followed by conventional cleaning sequences.

Needless to say, the disclosure is not limited to the described embodiments and examples, and implementation variants may be applied thereto without departing from the scope of the invention as defined by the claims.

The invention claimed is:

1. A process for manufacturing a composite structure comprising a thin layer made of monocrystalline silicon carbide arranged on a carrier substrate made of silicon carbide, the process comprising:
   a) a step of providing a donor substrate made of monocrystalline silicon carbide;
   b) a step of ion implantation of light species into the donor substrate to form a buried brittle plane delimiting the thin layer between the buried brittle plane and a free surface of the donor substrate;
   c) a succession of n steps of forming crystalline carrier layers, with n greater than or equal to 2, the n crystalline carrier layers being positioned on a front face of the donor substrate successively one on the other and forming the carrier substrate, each formation step comprising:
      direct liquid injection chemical vapor deposition, at a temperature below 900° C., to form a carrier layer, the carrier layer being formed by an at least partially amorphous SiC matrix, and having a thickness of less than or equal to 200 microns; and
      a crystallization heat treatment of the carrier layer, at a temperature of less than or equal to 1000° C., to form a crystalline carrier layer; and
   d) a step of separation along the buried brittle plane to form, on the one hand, a composite structure comprising the thin layer on the carrier substrate and, on the other hand, a remainder of the donor substrate.

2. The process of claim 1, further comprising:
   e) a step of mechanical and/or chemical treatment of the composite structure, the mechanical and/or chemical treatment being applied to a free rear face of the composite structure, and/or to a free face of the thin layer.

3. The process of claim 2, wherein step e) comprises simultaneous chemical-mechanical polishing of the front face and of the rear face of the composite structure.

4. The process of claim 1, wherein chemical etching, mechanical grinding and/or chemical-mechanical polishing is applied to a free face of the carrier substrate between step c) and step d).

5. The process of claim 1, wherein the thickness of each deposited carrier layer is less than or equal to 100 microns.

6. The process of claim 1, wherein the chemical vapor depositions in step c) are performed at a temperature of between 100° C. and 800° C.

7. The process of claim 1, wherein the chemical vapor depositions in step c) are performed at a pressure of between 1 Torr and 500 Torr.

8. The process of claim 1, wherein precursors used during the chemical vapor depositions in step c) are chosen from polysilylethylene and disilabutane.

9. The process of claim 1, wherein step c) comprises a succession of n steps of forming crystalline carrier layers, with n between 3 and a few dozen.

10. The process of claim 1, wherein step a) comprises:
    a') a step of providing an initial substrate made of monocrystalline silicon carbide; and
    a") a step of epitaxial growth of a monocrystalline silicon carbide donor layer on the initial substrate to form the donor substrate, the monocrystalline silicon carbide donor layer having a density of crystal defects less than that of the initial substrate.

11. The process of claim 10, wherein step a') comprises formation, on the initial substrate, of a monocrystalline conversion layer to convert basal plane dislocation defects of the initial substrate into threading edge dislocation defects.

12. The process of claim 10, wherein the epitaxial growth step a") is performed at a temperature above 1200° C.

13. The process of claim 1, wherein the separation step d) is performed at a temperature greater than or equal to the temperature of the crystallization heat treatments of step c).

14. The process of claim 1, further comprising a step of reconditioning the remainder of the donor substrate to reuse the donor substrate as another initial substrate or as another donor substrate.

15. The process of claim 5, wherein the thickness of each deposited carrier layer is less than or equal 50 microns.

16. The process of claim 15, wherein the thickness of each deposited carrier layer is less than or equal 10 microns.

17. The process of claim 6, wherein the chemical vapor depositions in step c) are performed at a temperature of between 200°° C. and 600° C.

18. The process of claim 12, wherein the epitaxial growth step a") is performed at a temperature between 1500° C. and 1650° C.

* * * * *

UNITED STATES PATENT AND TRADEMARK OFFICE
CERTIFICATE OF CORRECTION

| | | Page 1 of 1 |
|---|---|---|
| PATENT NO. | : 12,159,781 B2 | |
| APPLICATION NO. | : 17/907517 | |
| DATED | : December 3, 2024 | |
| INVENTOR(S) | : Hugo Biard | |

It is certified that error appears in the above-identified patent and that said Letters Patent is hereby corrected as shown below:

In the Claims

Claim 17, Column 14, Line 43, change "between 200°° C. and 600° C." to --between 200° C. and 600° C.--

Signed and Sealed this
Eighteenth Day of February, 2025

Coke Morgan Stewart
*Acting Director of the United States Patent and Trademark Office*